United States Patent [19]

Meiling et al.

[11] 3,895,390

[45] July 15, 1975

[54] METAL OXIDE SEMICONDUCTOR STRUCTURE AND METHOD USING ION IMPLANTATION

[75] Inventors: Gerald S. Meiling, Cupertino; Thomas P. Cauge, Mountain View, both of Calif.

[73] Assignee: Signetics Corporation, Sunnyvale, Calif.

[22] Filed: June 26, 1974

[21] Appl. No.: 483,157

Related U.S. Application Data

[63] Continuation of Ser. No. 309,431, Nov. 24, 1972, abandoned.

[52] U.S. Cl. .................................... 357/23; 357/91

[51] Int. Cl. ............................................ H01l 11/14

[58] Field of Search ................................ 357/23, 91

*Primary Examiner*—Martin H. Edlow

*Attorney, Agent, or Firm*—Flehr, Hohbach, Test, Albritton & Herbert

[57] ABSTRACT

Metal oxide semiconductor structure with a precisely controlled channel formed by a combination of diffusion and implantation through a common mask.

16 Claims, 16 Drawing Figures

INVENTORS
GERALD S. MEILING
THOMAS P. CAUGE
BY
Flehr, Hohbach, Test, Albritton & Herbert INVENTORS
GERALD S. MEILING
THOMAS P. CAUGE
BY
Flehr, Hohbach, Test,

METAL OXIDE SEMICONDUCTOR STRUCTURE AND METHOD USING ION IMPLANTATION

This is a continuation of application Ser. No. 309,431 filed Nov. 24, 1972, now abandoned.

BACKGROUND OF THE INVENTION

1. Field of the Invention

This invention relates to metal oxide semiconductor structure and method using ion implantation to provide a precisely controlled channel.

2. Description of the Prior Art

In copending application Ser. No. 854,370 filed Sept. 2, 1969 there is disclosed a high voltage, high frequency metal oxide semiconductor (hereinafter called MOS) device and method in which a double diffusion is utilized for forming the channel. There, however, is still a need for a more precisely formed channel in such structures. There is also a need for a structure and method in which the surface through which the diffusions are made is kept clean. There is therefore need for new and improved MOS structure and method.

SUMMARY OF THE INVENTION AND OBJECTS

The MOS structure consists of a semiconductor body of one conductivity type. A layer of semiconductor material of opposite conductivity type is carried by the semiconductor body and has a planar surface. A mask is formed on the surface and has a predetermined pattern. A first diffused region of said one conductivity type is formed in the body and is defined by a first PN junction extending to the surface below said mask and to said semiconductor body. A second diffused region of opposite conductivity type is formed within said first diffused region and has substitutional ions therein and being defined by a second PN junction extending to the surface. The first and second PN junctions define a channel of precise length underlying the mask. A layer of insulating material overlies the surface. Contact metallization is provided on the layer of insulating material and extends through said layer of insulating material.

In general, it is an object of the present invention to provide a metal oxide semiconductor structure and method in which ion implantation is utilized to improve the self-aligning characteristics of the gate mask.

Another object of the invention is to provide a structure and method of the above character in which the gate mask remains throughout the process.

Another object of the invention is to provide a structure and method of the above character in which the surface of the semiconductor body is kept clean.

Another object of the invention is to provide a structure and method of the above character in which the channel length can be precisely controlled.

Another object of the invention is to provide a structure and method of the above character which makes it possible to manufacture the structures more economically and easily.

Additional objects and features of the invention will appear from the following description in which the preferred embodiments are set forth in detail in conjunction with the accompanying drawing.

DESCRIPTION OF THE PREFERRED EMBODIMENTS

Figures 1, 2, 3, 4, 5, 6, 7, 8, 9, 10, 11, 12, 13:
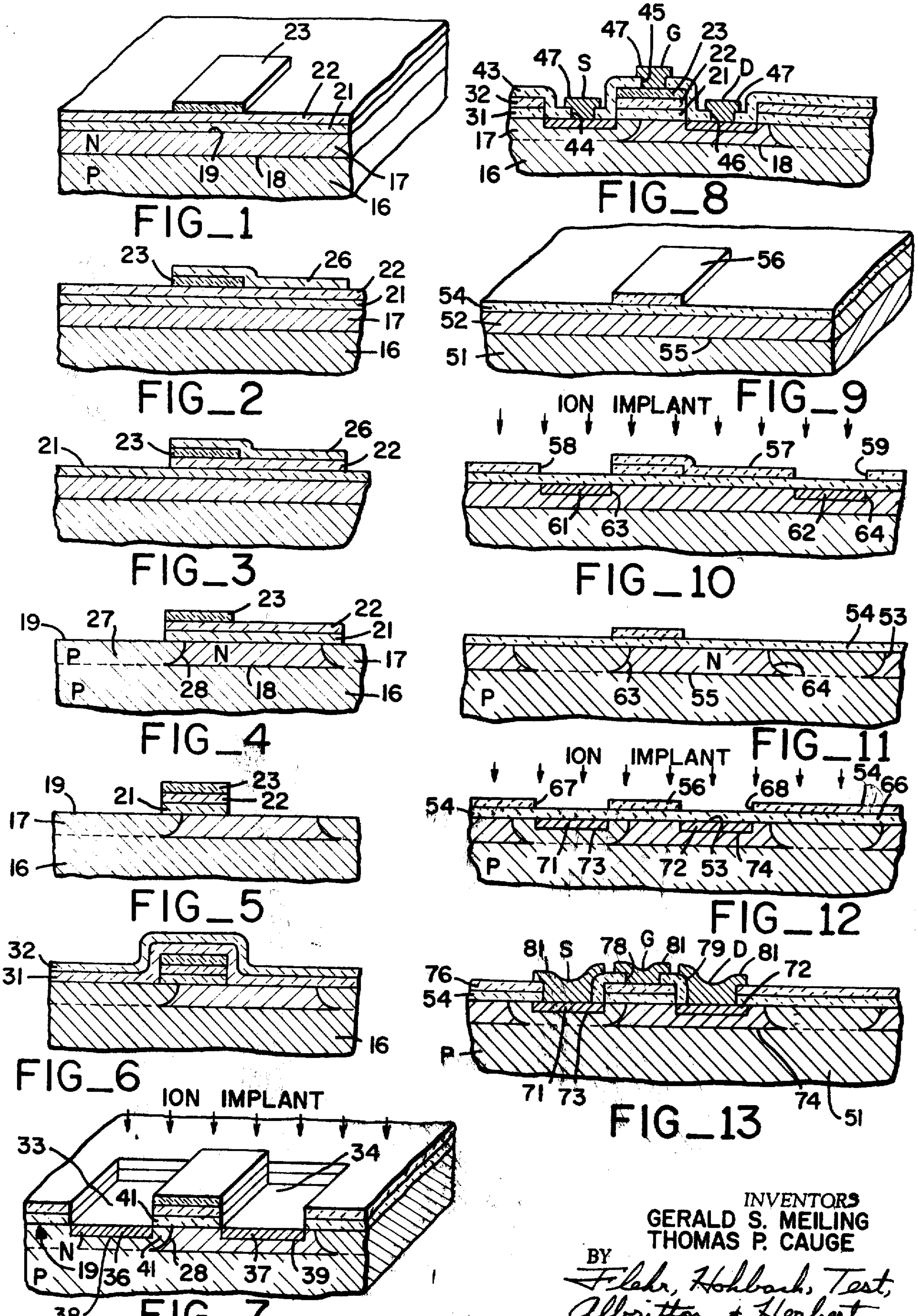
FIGS. 1 through 8 are cross-sectional views, certain of which are isometric, howing the steps in fabricating the metal oxide semiconductor structure incorporating the present invention.
FIGS. 9 through 13 are cross-sectional views, certain of which are also isometric views, showing the steps for fabricating another semiconductor structure incorporating the present invention.

In fabricating the MOS structure incorporating the present invention, a body or substrate 16 formed of a suitable semiconductor material such as silicon containing a P type impurity is provided. layer 17 of semiconductor material is formed on the body or substrate 16 and preferably is provided with an N type impurity whereby a PN junction 18 is provided which generally lies in a plane that is parallel to a planar surface 19 provided on the layer 17. The layer 17 can be formed in a suitable manner such as by epitaxial growth and can have a thickness ranging from less than 1 micron to 3 microns. Alternatively, if desired, the layer 17 can be formed by ion implantation of an N type dopant to convert the surface portion of the body or substrate 16 to one containing an N type impurity to the desired depth and then thereafter annealling the semiconductor body or substrate 16 to minimize the damage from ion bombardment.

As soon as the layer 17 has been formed, a thin layer of a suitable insulating material such as silicon dioxide is formed on the surface 19 of the epitaxial layer 17. This silicon dioxide layer 21 can be formed in a suitable manner such as by thermal growth or by depositing the same in an epitaxial reactor. Thereafter, another layer 22 is provided formed of a material such as silicon nitride which will be selectively attacked by an etch different from an etch which will attack the silicon dioxide layer 21. The silicon nitride can be deposited in a conventional manner as for example in an epitaxial reactor. Another layer 23 is then formed on the silicon nitride layer 22 and can consist of a suitable material such as polycrystalline silicon. It also can be deposited in an epitaxial reactor in a conventional manner to a depth in the order of 6,000 Angstroms.

After the layers 21, 22 and 23 have been formed, a first mask (not shown) is utilized in connection with conventional photolithographic and etching techniques to strip away substantially all of the polycrystalline layer 23 except a portion thereof which is to overlie the gate of the metal oxide semiconductor structure which is to be formed. The polycrystalline material which remains can have any desired geometry, as for example, rectangular as shown in FIG. 1.

Thereafter, as shown in FIG. 2, a layer 26 formed of a suitable material such as silicon dioxide is deposited over the entire top surface of the structure shown in FIG. 1. The silicon dioxide is deposited to a thickness ranging from 1,000 to 2,000 Angstroms. A second mask (not shown) in conjunction with conventional photolithographic and etching techniques is utilized for delineating the P type diffusion area and thereafter the undesired portions of the silicon dioxide layer 26 are removed so that what remains can be utilized for masking the silicon nitride layer 22 as shown in FIG. 2.

The exposed silicon nitride is then removed by a suitable etch so that there only remains the silicon nitride that is under the silicon dioxide layer 26 as shown in FIG. 3.

Thereafter, as shown in FIG. 4, the silicon dioxide layers 26 and 21 which are exposed are etched away as shown in FIG. 4. A P type impurity is then diffused in a suitable manner through the exposed surface 19 of the layer 17 to form a channel region 27 which extends from the surface 19 through the layer 17 down to the substrate or body 16. The channel region 27 is defined by a dish-shaped PN junction 28 which extends from the surface 19 from a region underlying the polycrystalline layer 23 downwardly and inwardly to the PN junction 18 and to the substrate 16.

Typically, the diffusion of this P type impurity into the layer 17 can be accomplished by laying down a layer of boron glass which is deposited at a low temperature, as for example, 400°C. so that there is provided in the region 27 a surface concentration of $10^{17}$ atoms per cubic cm. or up to a possible range extending from $10^{16}$ to $10^{18}$ atoms per cubic cm. After the boron glass is deposited, it is diffused into the layer 17 by taking the structure shown in FIG. 4 and placing it in a diffusion furnace at a temperature ranging from 1,050° to 1,150°C. for a period of time ranging from one-half hours to 3 hours to obtain the desired channel depth, as for example, a depth of 1 – 3 microns. The silicon nitride layer 22 protects the silicon dioxide layer 21 which defines the inner extent of the channel region 27.

After the P type diffusion has been carried out, to provide the channel region 27 shown in FIG. 4, the exposed silicon nitride layer 22 is removed by a suitable etch and thereafter, the exposed silicon dioxide layer 21 is also removed by suitable etch. A portion of the silicon nitride layer 22 and the silicon dioxide layer 21 underlying the polycrystalline layer 23 are not stripped off so that there remains a pillar formed of the silicon dioxide layer 21, the silicon nitride layer 22 and the polycrystalline silicon layer 23 all of which have the configuration of the gate for the semiconductor structure.

A silicon nitride layer 31 is then deposited in a conventional manner on the surface 19 and over the pillar formed by the layers 21, 22 and 23. Then a layer 32 of silicon dioxide is deposited on the layer 31 in a conventional manner.

A third mask (not shown) is then utilized in connection with conventional photolithographic and etching techniques to expose certain areas of the silicon dioxide layer 32 to form openings 33 and 34 for formation of the source and drain respectively and to uncover the pillar. The portion of the silicon dioxide layer 32 which remains acts as a mask for the silicon nitride. Thereafter, the silicon nitride in the holes 33 is removed so that the surface 19 of the layer 17 is exposed on opposite sides of the pillar used to cover the gate region. The silicon nitride passing over the top of the polycrystalline layer 23 of the pillar also is removed. It will be noted that the openings 33 and 34 have a rectangular geometry. However, if desired other configurations can be utilized such as circular.

An N type impurity is implanted through the portions of the surface 19 exposed through the openings 33 and 34 to form N type source and drain regions 36 and 37 respectively. Impurities are also implanted into the polycrystalline layer 23 to make it conductive. In accordance with the present invention, it is preferable that the N type impurity can be driven in by ion implantation. Typically, this can be performed by a 150 keV beam directed at the semiconductor structure shown in FIG. 7 using phosphorous pentaflouride as a source for a suitable period of time as for example, ranging from 10 minutes to one hour to obtain the desired concentration for the regions. The layers 31 and 32 of silicon nitride and silicon dioxide are sufficiently thick to protect the surface 19. The regions 36 and 37 are defined by junctions 38 and 39 respectively which are perpendicular to the surface 19, or in other words, extend downwardly in a straight line which is typical of impurities driven in by ion implantation. It can be seen that the porton of the junction 38 adjacent the upper portion of the junction 28 underlying the polycrystalline layer 23 was formed by diffusion in which the outer margin of the polycrystalline layer 23 served as the mask to obtain great precision in the formation of a channel 41 underlying the polycrystalline layer 23. By way of example, the active channel 41 can have a width of approximately 1 micron which is precisely controlled by utilizng the ion implantation step.

After the ion implantation has been carried out, the structure shown in FIG. 7 is annealled at a temperature of approximately 900°C. for a perid of approximately 10 minutes to make over 90% of the implanted ions electrically active by transferring interstitially deposited ions into substitutionally positioned ions. The annealling also cures any radiation damage and relieves any possible charge concentration.

After the annealling operation has been completed, a relatively thick layer 43 of insulating material of a suitable type such as silicon dioxide is formed over the structure shown in FIG. 7 and into the openings or windows 33 and 34. Openings 44, 45 and 46 are formed in the insulating layer 43 by the use of a fourth mask (not shown) and photolithographic and etching techniques to expose the source and drain regions 36 and 37 respectively and to expose the polycrystalline layer 23. A layer 47 of metallization of a suitable type such as aluminum is deposited on the surface of the insulating layer 43 and into the contact openings 44, 45 and 46. A fifth mask (not shown) is then utilized in conjunction with conventional photolithographic and etching techniques to etch away the undesired portions of the metal layer 47 so that there remains contact stripes or elements for the source indicated by "S," for the gate indicated by "G" and for the drain indicated by D. These contact stripes are connected to other parts of the circuit by metal leads formed from the layer 47. This then completes the structure.

From the foregoing it can be seen that the polycrystalline layer 23 has been utilized for the formation of the gate and can be characterized as a polygate process forming a self-aligned gate for P channel MOS circuits. From the construction shown, it can be seen that the gate silicon dioxide layer 21 is deposited at the beginning of the fabrication and can be precisely controlled. The surface below the oxide layer 24 is therefore kept clean and in addition the silicon dioxide is preserved in its clean condition by the polycrystalline layer 23. As can be seen from the construction, the portions of the layers 21, 22 and 23 overlying the gate are never removed and for that reason the gate is very stable. The two separate steps of driving in impurities for formation of the channel utilize the same outer margins or outline of the polycrystalline layer 23 as a mask so that the gate is self-aligned and the dielectrics are stable.

The source and drain are isolated from each other by a PN junction consisting of the PN junction 18 in combination with the PN junction 28.

The polycrystalline silicon layer 23 simulates the conventional metal electrode which is provided over the gate. Thus, it can be seen, that the polycrystalline layer 23 serves as a mask to preserve the gate oxide layer 21 and secondly after it has been diffused, it acts as a low resistance ohmic contact to any metal which contacts the gate. The polycrystalline layer 23 serves as a convenient mask during the source and drain formations while at the same time providing the self-alignment of the gate which is desired.

The use of ion implantation for the second doping step is advantageous in forming a more precise channel because the width of the channel can be better controlled. This is true because the second doping process takes place at a lower temperature than a diffusion process and therefore the channel width is essentially a function of the reproducibility of the first diffusion rather than the difference between two diffusions. The self-alignment gate process which is utilized also reduces parasitic capacitances. The polysilicon gate produces MOS devices which have a low threshold. Yield of the process is also relatively high because it is possible to obtain greater precision with the ion implantation process than with a conventional diffusion process.

It should be appreciated that if desired, the present method can utilize a conventional diffusion step and eliminating the ion implantation step. However, the ion implantation step will give a more precise channel for reasons hereinbefore explained.

It has been found by utilizing the present method it is possible to obtain a factor of 10 improvement for certain characteristics of P channel MOS transistors of a conventional type. Maximum frequency of oscillation has been measured directly as high as 4 GC and theoretically has been calculated as high as 10GC. Switching measurements show performance comparable to some of the highest speed bipolar transistors with typically less than half a millisecond rise time and less than half a millisecond storage time.

Conventional MOS transistors need not be isolated from each other in the same way as bipolar transistors. The same is true with respect to the present MOS structures and therefore it is possible to retain a high packing density for such devices. Thus, succinctly stated, the present invention makes it possible to obtain semiconductor devices which have responses which are characteristic of the best bipolar devices while still retaining the MOS packing density.

Another embodiment of the invention shown in FIGS. 9 through 13 in which there is shown a metal oxide semiconductor (MOS) structure consisting of a body or substrate 51 formed of a suitable material such as silicon carrying a P type impurity. A layer 52 of a suitable type such as a layer of silicon carrying an N type impurity is formed on the body 51 and a PN junction 55 is formed between the body 51 and the layer 52. It can be deposited in the manner described in connection with the preceding embodiment. The layer 52 is provided with a planar surface 53 on which there is deposited a layer 54 of a suitable insulating material such as silicon dioxide having a relatively precise thickness, as for example, 1,000 Angstroms. A polycrystalline layer 56 is then deposited on the surface of the layer 54. Thereafter by the use of a first mask (not shown) and conventional photolithographic techniques, a suitable etch is utilized to remove the undesired portions of the polycrystalline layer 56 so that there remains a portion covering the gate of the semiconductor structure to be formed. The polycrystalline layer 56 at this point has very low conductivity.

It should be appreciated that during the present process, the silicon dioxide layer 54 is not removed. It is preferably thermally grown so that its characteristics can be readily controlled and so that it does not have any pinholes. This means that the entire surface 19 is kept clean during the processing steps.

Thereafter, as shown in FIG. 10, a layer 57 formed of a suitable conducting metal such as aluminum is utilized. A second mask (not shown) is then utilized with conventional photolithographic and etching techniques to etch away the undesired metal to form windows 58 and 59 through which a P type impurity is to be implanted. It will be noted that the edge of the polycrystalline silicon layer 56 adjacent the window or opening 58 is exposed by the metal layer 57. A P type impurity is then implanted by ion implantation through the windows 58 and 59 by the utilization of a suitable ion beam such as boron to provide regions 61 and 62 which extend to a depth ranging from 1,000 to 2,000 Angstroms and with a total concentration at the surface of approximately $2 \times 10^{17}$ cubic cm. The regions 61 and 62 are defined by PN junctions 63 and 64 which extend to the surface and which are provided straight sides which exactly coincide or register with the windows 58 and 59.

Thus, it can be seen that in the present embodiment, the first step is carried out by ion implantation. The implantation can be carried out at a suitable voltage, as for example, 150 keV for a period of time ranging from 10 seconds to 20 minutes. The metal layer 57 has been provided to protect the remainder of the semiconductor structure from ion bombardment. In the preceding embodiment, as explained previously the various layers of silicon nitride and silicon dioxide and the like were sufficiently thick so as to protect the surface 19 of the layer 17 and therefore a metal layer was not required.

After ion implantation has been carried out, the metal layer 57 is stripped and the semiconductor structure is placed in a diffusion furnace at a temperature ranging from 1,050° to 1,150°C. for a period of time ranging from 30 minutes to three hours to cause the regions 61 and 62 to be diffused to a suitable depth, as for example, 1–3 microns. During the time this is occurring, the PN junctions 63 and 64 will move laterally as shown in FIG. 11, and so that the PN junction 63 underlies the polycrystalline layer 56 and extends down to the P-type body 51.

In the next step as shown in FIG. 12, the surface 53 as well as the polycrystalline layer 56 is again covered with a suitable metal layer 66 such as aluminum. By utilization of a third mask and photolithographic and etching techniques, the polycrystalline layer 56 is uncovered and in addition openings 67 and 68 are formed in the metal layer 66. Thereafter, an N type impurity is implanted through the openings 67 and 68 and through the silicon dioxide layer to form regions 71 and 72 which are defined by junctions 73 and 74 with the junctions having straight sides and being coincident or in registration with the openings 67 and 68. At the same time the N type impurity also is driven into the polycrystalline layer 56 to make it conductive. The ions can be implanted so that there is a concentration of N type impurity at the surface of approximately $10^{20}$ atoms per cubic cm. with each of the regions having a depth of approximately 0.2 microns.

After the ion implantation step has been carried out, the metal layer 66 can be stripped away and thereafter the semiconductor structure can be annealed at a suitable temperature such as 900°C. to achieve the desired activity and to eliminate the radiation induced damage. A relatively thick layer 76 of a suitable material such as silicon dioxide is formed on the thin layer 54. The thick layer can have a thickness ranging from 5,000 to 6,000 Angstroms. Openings 77, 78 and 79 are then formed in the oxide layer. A layer 81 of metallization of a suitable metal such as aluminum is then deposited over the surface of the thick oxide layer 76 and into the openings 77, 78 and 79. Thereafter, a fifth mask (not shown) is utilized to etch away the undesired metal so that there remains contact stripes extending into the openings 77, 78 and 79 and identified as the source, gate and drain contact stripes respectively by the letters S, G and D. Other portions of the metallization connect the MOS device onto an integrated circuit.

Figure 14:
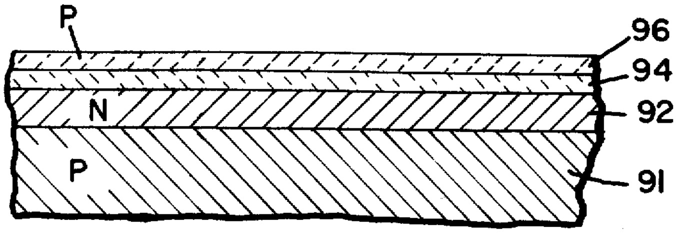
FIGS. 14 through 16 are cross-sectional views showing certain steps in an alternative process for fabricating semiconductor structures incorporating the present invention.
Figure 15:
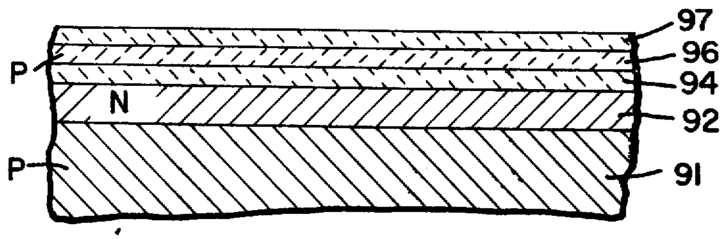
Figure 16:
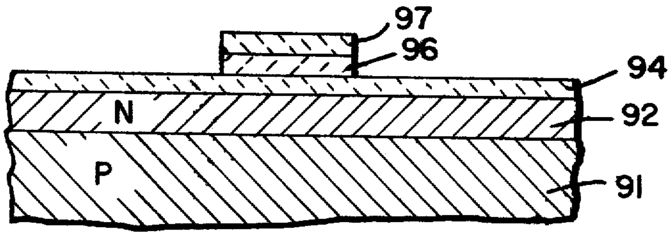

An alternative process for fabricating the semiconductor structure as incorporated in the present invention is shown in FIGS. 14 through 16. A body or substrate 91 formed of suitable semiconductor material such as silicon containing a P type impurity is utilized. A layer 92 is formed on the boby 91 and is preferably formed of a semiconductor material which carries an N type impurity. A PN junction 93 is formed between the body 91 and the layer 92. A layer 94 of a suitable insulating material such as silicon dioxide is formed on the layer 92 and a layer 96 formed of polycrystalline silicon is provided on the layer 94. A suitable P type impurity such as boron is then diffused into the polycrystalline layer 96 so that the impurities extend all the way through the polycrystalline layer 96.

After the diffusion of the P type impurity has been completed to make the polycrystalline layer 96 conductive, a layer 97 of a suitable insulating material is deposited over the polycrystalline layer 96 to a suitable depth as for example 1,500 Angstroms. Thereafter, a mask is utilized in a conventional manner to strip the undesired portions of the insulating layer 97 and also to strip the undesired portions of the polycrystalline layer 96 so that all that remains is a portion which is to overlie the gate of the device which is to be formed in the semiconductor structure shown in FIG. 15. The layer of silicon dioxide 97 which remains over the polycrystalline layer protects the polycrystalline layer 96 and prevents the formation of a PN junction within the polycrystalline layer during subsequent ion implantation steps. The structure which is shown in FIG. 16 then corresponds to the structure which is shown in FIGS. 1 and 9 of the preceding methods of fabrication. The methods of fabrication herein disclosed can thereafter be utilized to fabricate the desired devices within the structure.

The method shown in FIGS. 14, 15 and 16 has the advantage in that the polycrystalline layer which overlies the gate is doped with an impurity all the way through and thus makes an excellent low resistance contact with any metal which contacts the gate.

From the foregoing it can be seen that the polycrystalline layer overlying the gate region can be doped in a number of ways still utilizing the present invention.

It can be seen that the foregoing process has certain advantages over the process described in conjunction with the first embodiment. It can be seen that it is basically much simpler because it does not require use of a silicon nitride dielectric layer. It also can be seen that it takes advantage of ion implantation for predeposition prior to the first diffusion step. In addition, the surface through which the diffusions take place is always covered by a passivating oxide layer.

The use of the ion implant for the first diffusion is very important because it makes it possible to obtain low concentrations with uniformity. By utilizing the ion implantation step it is possible to precisely meter the number of atoms which are being placed in a region.

Also from the foregoing it can be seen that it is possible to manufacture the semiconductor structures more economically because they are easier to make. In addition, there is an increased yield because it is possible to more precisely control the first diffusion. Also, ion implantation is utilized for the second step. Both steps are carried out utilizing the same critical edges of the same mask.

It is therefore apparent from the foregoing that there has been provided a new and improved metal oxide semiconductor structure which has many advantages and a method for fabricating the same.

I claim:

1. In a metal oxide semiconductor structure of the type having a gate, source and drain, a semiconductor body of one conductivity type, a layer of semiconductor material of opposite conductivity type disposed on the body and having a planar surface, a mask formed on said surface and having a predetermined pattern, said mask having a portion overlying and generally conforming to the geometry of the gate of the semiconductor structure, a first region of said one conductivity type having a controlled doping profile formed in said layer and being defined by a first generally dish-shaped PN junction extending to said surface below said portion of said mask and to said semiconductor body, second and third regions of opposite conductivity type formed in said layer and having implanted substitutional ions therein, said second region being disposed within said first region and being defined by a second PN junction with the second PN junction extending to the surface along a line in registration with the outline of said portion of said mask and being in relatively close proximity to said first PN junction to provide a precision channel therebetween with a precise length of approximately 1 micron and a controlled doping profile determined exclusively by the doping profile of the first region, said third region being disposed in said layer of semiconductor material of opposite conductivity type outside of said first region, said second and third regions serving as the source and drain regions respectively, a layer of insulating material overlying said surface and covering said second and third regions and said mask, a relatively thin layer of insulating material underlying said mask and adherent to said surface, contact elements extending through said layer of insulating material and making contact with said second and third regions to form source and drain contacts and making contact with said mask to provide a gate contact.

2. A structure as in claim 1 wherein said mask is formed of a conducting material.

3. A structure as in claim 1 wherein said first and second PN junctions define a channel having a relatively precise length underlying said mask.

4. A structure as in claim 1 wherein said first PN junction has a portion underlying said mask which curves inwardly and downwardly from the mask and said second PN junction is provided with a portion which extends downwardly in a straight line from the mask.

5. A structure as in claim 4 wherein said layer of insulating material underlying said mask extends across the entire surface of the layer.

6. A structure as in claim 1 together with an additional layer of insulating material disposed between the first named layer of insulating material below the mask, said additional layer of insulating material being of the type which is subject to attack by an etch different from an etch which will attack the material forming the first named layer of insulating material.

7. A structure as in claim 6 wherein said semiconductor body and said layer of semiconductor material are formed of silicon, said mask is formed of polycrystalline silicon and said additional layer of insulating material is formed of silicon nitride.

8. A structure as in claim 1 wherein said first region has implanted substitutional ions.

9. A structure as in claim 1 wherein a relatively thick layer of insulating material is formed directly on said first named layer of insulating material.

10. A structure as in claim 1 wherein said portion of said mask is formed of a polycrystalline silicon having an impurity therein to make it conductive.

11. In a metal oxide semiconductor structure of the type having a gate, source and drain, a layer of semiconductor material of one conductivity type and having a planar surface, a first diffused region of opposite conductivity type formed in the layer and having a controlled doping profile as determined substantially exclusively by a single diffusion operation and extending to said surface, a predetermined region of said one conductivity type formed in the layer immediately adjacent the first region, said first region and said predetermined region being defined by a PN junction having sides which are arcuate in a cross-section and extend downwardly from said surface in such a manner so that said predetermined increases in cross-sectional area as the predetermined region increases in depth, a second region of said one conductivity type formed in said first region and having implanted ions of the impurity of said one conductivity type therein, said second region having a depth substantially less than the depth of the first region and being defined by a second PN junction having a portion extending to the surface in a vertical direction in cross section, said second PN junction being in relatively close proximity to but spaced from said first PN junction to provide a precision channel therebetween with a precision length and a controlled doping profile determined exclusively by the doping profile of the first region, said second region extending outwardly away from said predetermined region, a third region of said one conductivity type formed in said predetermined region and extending to said surface, said second and third regions serving as source and drain regions respectively, a layer of insulating material overlying said surface, contact elements extending through said layer of insulating material and making contact with said second and third regions to form source and drain contacts and gate metallization overlying said channel.

12. A structure as in claim 11 wherein said channel has a precise length of approximately 1 micron.

13. In a metal oxide semiconductor structure, a body of supporting material, a layer of semiconductor material of one conductivity type carried by the body and having a planar surface, a first region of opposite conductivity type formed in said layer and having a controlled doping profile as determined sugstantially exclusively by a single diffusion operation and extending to said surface a predetermined region of said one conductivity type formed in the layer immediately adjacent said first region, said first region and said predetermined region being defined by a first PN junction having a side which is arcuate in cross-section and extends from said surface down through said layer to said body in such a manner so that the predetermined region increases in cross-sectional areas as the predetermined region incrases in depth, a second region of said one conductivity type formed in said first region and having implanted ions of said one conductivity type therein, said second region having a depth substantially less than the depth of the first region and being defined by a second PN junction having a side portion extending to the surface in a vertical direction in cross section and being in relatively close proximity to but spaced from one side of one of said first PN junction to provide a precision channel therebetween with a precise length and the controlled doping profile of the first region, said second region extending outwardly away from said predetermined region, a third region of said one conductivity type disposed in said predetermined region and extending to said surface, said second and third regions serving as the source and drain regions respectively, a layer of insulating material overlying said surface, contact elements extending through said layer of insulating material and making contact with said second and third regions to form source and drain contacts and gate metallization overlying said channel.

14. A structure as in claim 13 wherein said channel has a precise length of approximately one micron.

15. In a metal oxide semiconductor structure, a semiconductor body of one conductivity type, a layer of semiconductor material of opposite conductivity type disposed on the body and having a planar surface, a first region of opposite conductivity type formed in said layer and having a controlled doping profile as determined substantially exclusively by a single diffusion operation and extending to said surface, a predetermined region of one conductivity type formed in the layer immediately adjacent the first region said first region and said predetermined region being defined by a PN junction having a side portion which is arcuate in cross-section and extends from said surface through said layer and down to said body in such a manner so that said predetermined region increases in area in cross-section as the predetermined region increases in depth, a second region of opposite conductivity type formed in said first region and having implanted ions of said opposite conductivity type therein, said second region being defined by a second PN junction having a side portion extending to the surface along a vertical line in cross section in relatively close proximity to but spaced from said one side of said first PN junction to provide a precision channel therebetween with a precise length and a controlled doping profile determined exclusively by the doping profile of the first region, said second region extending outwardly away from said predetermined region, a third region of said one conductivity type disposed in said predetermined region and extending to said surface, said second and third regions serving as the source and drain regions respectively, a layer of insulating material overlying said surface, contact elements extending through said layer of insulating material and making contact with said second and third regions to form source and drain contacts and gate metallization overlying said channel.

16. A structure as in claim 15 wherein said channel has a precise length of approximately 1 micron.

* * * * *